US012616072B2

(12) United States Patent
Chen

(10) Patent No.: US 12,616,072 B2
(45) Date of Patent: Apr. 28, 2026

(54) LED STRIP AND LED STRIP COLOR MODULATION METHOD

(71) Applicant: Shenzhen Jianjiaweidu Technology Co., Ltd, Guangdong (CN)

(72) Inventor: Linfei Chen, Guangdong (CN)

( * ) Notice: Subject to any disclaimer, the term of this patent is extended or adjusted under 35 U.S.C. 154(b) by 61 days.

(21) Appl. No.: 18/589,363

(22) Filed: Feb. 27, 2024

(65) Prior Publication Data

US 2025/0273640 A1 Aug. 28, 2025

(51) Int. Cl.
*H05B 45/20* (2020.01)
*F21S 4/00* (2016.01)
*H01L 25/16* (2023.01)
*H05B 45/24* (2020.01)
*H05B 45/325* (2020.01)

(52) U.S. Cl.
CPC ........... *H01L 25/167* (2013.01); *H05B 45/24* (2020.01); *H05B 45/325* (2020.01)

(58) Field of Classification Search
CPC ........ H05B 45/00; H05B 45/20; H05B 45/24; H05B 45/30; H05B 45/32; H05B 45/325; F21S 4/00; F21S 43/14; F21S 43/15
See application file for complete search history.

(56) References Cited

U.S. PATENT DOCUMENTS

| | | | | |
|---|---|---|---|---|
| 10,136,485 B1 * | 11/2018 | Coetzee | ................ | H05B 45/42 |
| 11,006,492 B2 * | 5/2021 | Cumpston | .............. | H05B 47/19 |
| 2005/0116922 A1 * | 6/2005 | Kim | ....................... | H05B 45/46 |
| | | | | 345/102 |
| 2017/0245338 A1 * | 8/2017 | Turunen | ................ | H05B 47/16 |
| 2020/0389955 A1 * | 12/2020 | Price | ..................... | H05B 45/44 |
| 2022/0124885 A1 * | 4/2022 | Lin | ........................ | H05B 45/42 |

* cited by examiner

*Primary Examiner* — Thai Pham
(74) *Attorney, Agent, or Firm* — Nitin Kaushik

(57) ABSTRACT

A LED strip comprises at least three colors of LEDs and at least three signal lines, and an LED with one color is connected between every two signal lines; it further includes control components with the same number as the signal lines, and the control components are connected to one end of the signal lines; tit further includes a control system coupled with the control components and used for sequentially and circularly outputting two groups of control signals, thereby sequentially and circularly driving the two control components, and the total number of control signals output by the control system is not less than the number of LED colors.

13 Claims, 4 Drawing Sheets

LED STRIP AND LED STRIP COLOR MODULATION METHOD

TECHNICAL FIELD

The present invention relates to the technical field of LED lighting technology, in particular to a LED strip.

BACKGROUND

LED strip has the advantages of convenient use, rich colors and easy adjustment, and is widely used in all fields of life. At present, LED strip in the market has at least four signal lines. Generally speaking, three signal lines are each equipped with a plurality of LEDs of one color, and an additional signal line is set to form three loops. The chip is used to transmit PWM signals to power the LED respectively, and the dimming and color modulation functions of LED strip can be realized by adjusting the duty ratio of PWM signals. However, the power supply method of four signal lines adopted in the prior art cannot make the light strip longer; at the same time, due to the limitation of materials, the width of LED strip produced by this solution is generally not less than 8 mm; finally, this solution also needs more materials.

The US invention patent US20180363891A1 discloses a lamp belt driving circuit of an LED tri-copper lamp, which comprises a battery controller, a charging port P, a tri-copper lamp A and a tri-copper lamp B, and the output terminals DATE1, DATE2 and DATE3 of the battery controller are respectively connected with the two ends of the tri-copper lamp A and the tri-copper lamp B; the input terminal +5V of the battery controller is connected with the interface V+ of the switch K and the charging port P; the input terminal GND of the battery controller is connected with the resistor R and the interface GND of the charging port P; And the other end of resistor r is connected to the other end of switch K. In this solution, the LED lamp beads are welded on three copper wires, which can save materials and effectively reduce the fracture probability of the light strip. However, this solution still cannot make the light strip longer.

The US invention U.S. Pat. No. 11,399,419B2 discloses an electric load group circuit, a light strip and a control device thereof, which comprises four LED light sources and a plurality of control signal lines, wherein the first and second LED light sources are connected between the two control signal lines in opposite directions, the third LED light source is polarized and connected between one of the first and second LED light sources and an additional control signal line among the plurality of control signal lines, and the fourth LED light source is polarized and connected to the control signal line of the control signal line and one of the two control signal lines between the additional control signal lines, the connection polarities of the third and fourth LED light sources to the additional control signal lines of the control signal line are opposite to each other, and the third and fourth electrical loads are connected in opposite polarities. This solution uses control signal line multiplexing to carry multiple LEDs, but there is still a problem of low circuit utilization.

SUMMARY

In order to solve the problems existing in the prior art, the present invention provides a LED strip and a color modulation method for LEDs, in which at least three signal lines are used as power supply circuits, one end of each signal line is connected with a control component, and an LED is connected between every two signal lines, and a control system is used to generate a control signal and adjust the conduction direction of the control component, so as to light the LED between the two signal lines.

In order to achieve the above purpose, the technical solution of the present invention is as follows:

a LED strip, wherein the light strip comprises at least three LEDs with different colors and at least three signal lines, and an LED with one color is connected between every two signal lines; and wherein, the LED strip further comprises control components with a same number as the signal lines, and the control components are connected at one ends of the signal lines; and wherein the LED strip further comprises a control system coupled with the control components and used for sequentially and circularly outputting two groups of control signals so as to sequentially and circularly drive the two control components, and a total number of the control signals output by the control system is not less than a number of LED colors.

According to the solution disclosed by the present invention, at least three signal lines can be adopted to form a loop of LEDs with at least three colors, so that the reuse rate of the lines is improved, and the limit length of the light strip is improved; compared with the technical solution of using four signal lines in the prior art, only using three signal lines significantly reduces the width of the light strip, which can reach 5 or 5 mm, thus reducing the manufacturing cost of the light strip by 30%.

On the other hand, the present invention further provides:

a LED strip color modulation method, wherein at least three control components are respectively coupled to a control system and signal lines with a same number as the control components, and an LED of one color is connected between every two signal lines; and the control system sequentially and circularly outputs two groups of control signals, thereby sequentially and circularly driving the two control components, and a total number of the control signals output by the control system is not less than a number of LED colors.

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various embodiments of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

BRIEF DESCRIPTION OF DRAWINGS

In order to explain the technical scheme of this application more clearly, the drawings needed in the implementation will be briefly introduced below. Obviously, the drawings described below are only some implementations of this application. For those skilled in the art, other drawings can be obtained according to these drawings without creative work.

In the figures: 1, Control system; 2, Control component; 3, Signal line; 31, First signal line; 32, Second signal line; 33, Third signal line; 4, First LED; 41, Positively connected first LED; 42, Negatively connected first LED; 5, Second LED; 51, Positively connected second LED; 52, Negatively connected second LED; 6, Third LED; 61, Positively connected third LED; 62, Negatively connected third LED.

DESCRIPTION OF EMBODIMENTS

In describing the preferred embodiments, specific terminology will be resorted to for the sake of clarity. It is to be understood that each specific term includes all technical equivalents which operate in a similar manner to accomplish a similar purpose.

While various aspects and features of certain embodiments have been summarized above, the following detailed description illustrates a few exemplary embodiments in further detail to enable one skilled in the art to practice such embodiments. Reference will now be made in detail to embodiments of the inventive concept, examples of which are illustrated in the accompanying drawings. The accompanying drawings are not necessarily drawn to scale. The described examples are provided for illustrative purposes and are not intended to limit the scope of the invention. It should be understood, however, that persons having ordinary skill in the art may practice the inventive concept without these specific details.

It will be understood that, although the terms first, second, etc. may be used herein to describe various elements, these elements should not be limited by these terms. These terms are only used to distinguish one element from another. For example, a first attachment could be termed a second attachment, and, similarly, a second attachment could be termed a first attachment, without departing from the scope of the inventive concept.

It will be understood that when an element or layer is referred to as being "on," "coupled to," or "connected to" another element or layer, it can be directly on, directly coupled to or directly connected to the other element or layer, or intervening elements or layers may be present. In contrast, when an element is referred to as being "directly on," "directly coupled to," or "directly connected to" another element or layer, there are no intervening elements or layers present. Like numbers refer to like elements throughout. As used herein, the term "and/or" includes any and all combinations of one or more of the associated listed items.

As used in the description of the inventive concept and the appended claims, the singular forms "a," "an," and "the" are intended to include the plural forms as well, unless the context clearly indicates other.

Figure 1:
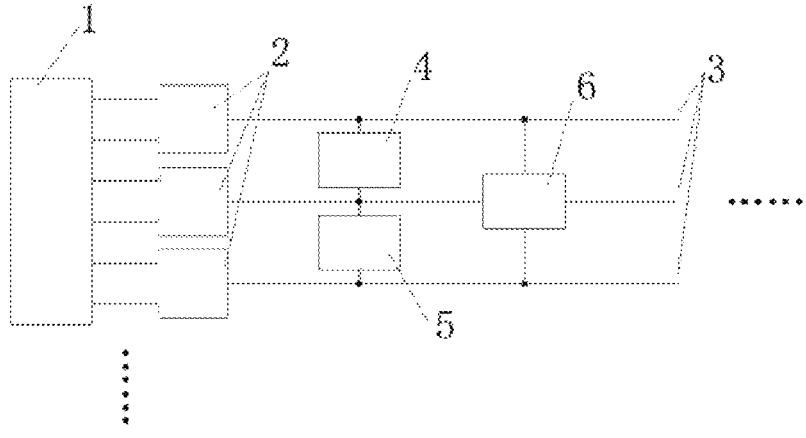
FIG. 1 is a schematic diagram of the present invention.

A LED strip as shown in FIG. 1 includes at least three signal lines and at least three LEDs with different colors. An LED with one color is connected between every two wires, and one end of each wire is connected with a control module, which is also electrically connected with a control system, and the control system outputs a control signal to the control module, thereby controlling the LED to work.

In some embodiments, the control component includes an H-bridge half-bridge circuit consisting of a P-type MOSFET and an N-type MOSFET; in other embodiments, the same effect can be achieved by setting additional chips to drive two N-type MOSFETs.

Figure 3:
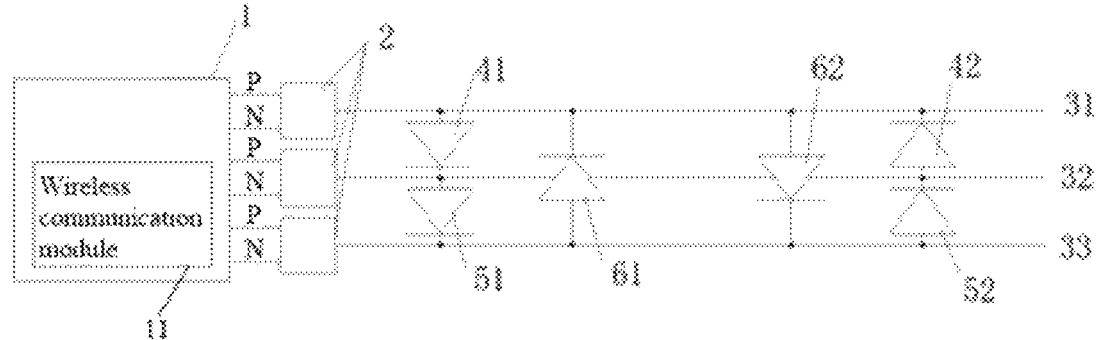
FIG. 3 is a schematic diagram of a light strip with bidirectional LEDs according to the present invention.
Figure 5:
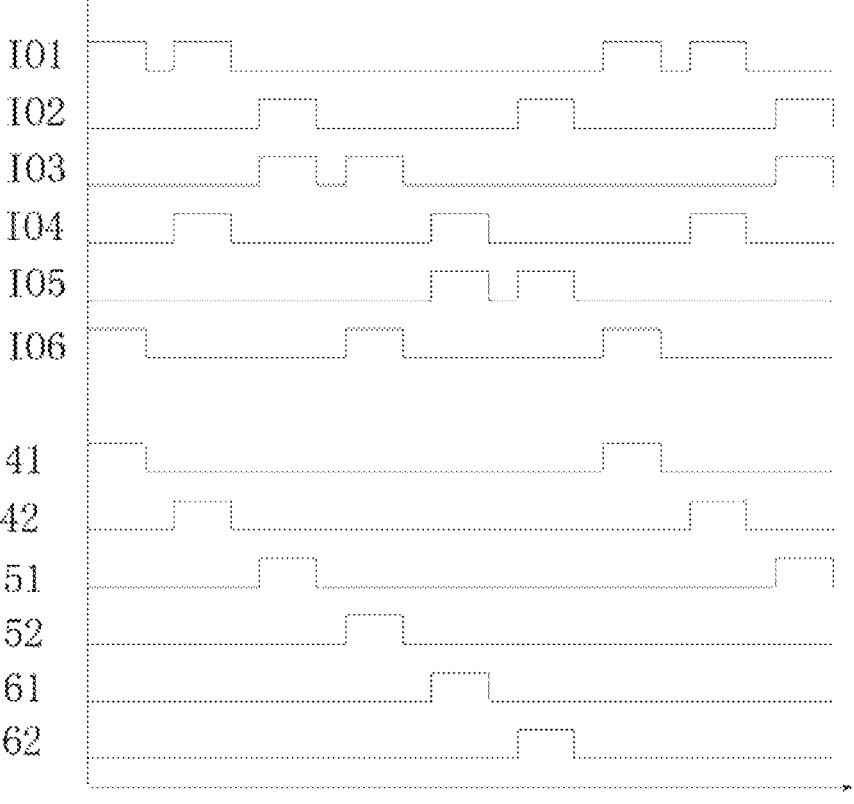
FIG. 5 is a timing chart with bidirectional LEDs according to the present invention.
Figure 6:
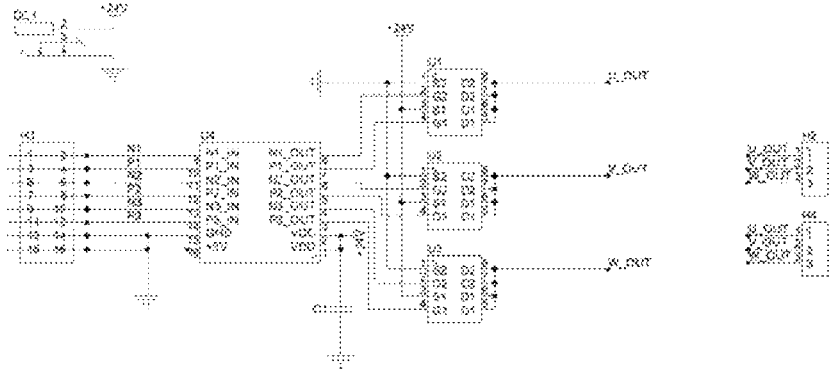
FIG. 6 is a circuit diagram of a light strip using a driving chip according to the present invention.
Figure 7:
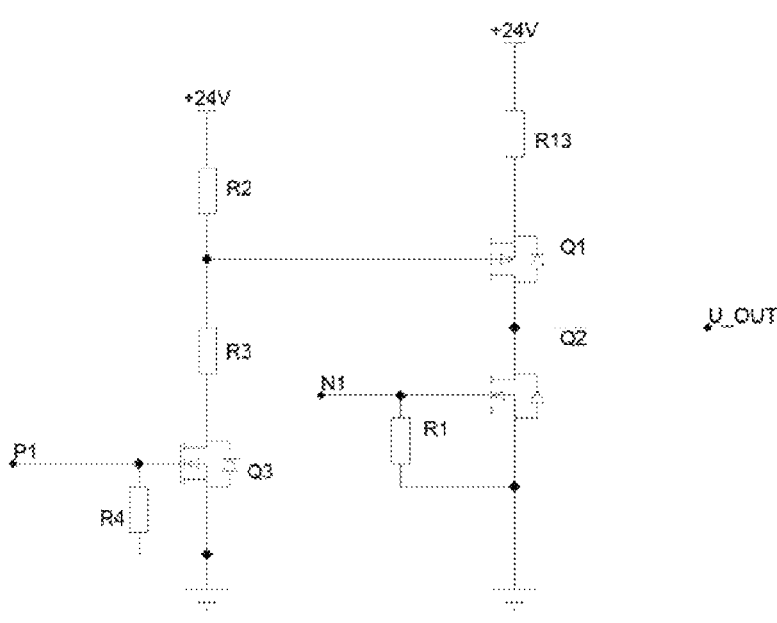
FIG. 7 is a schematic diagram of a control module including a P-type MOSFET and an N-type MOSFET used in the present invention.

In some specific embodiments, as shown in FIG. 3, the light strip includes a signal line 31, a signal line 32 and a signal line 33, and also includes three LEDs with different colors; wherein, an LED with one color is connected between every two signal lines in two directions, specifically:

the anode of the LED41 is connected to the signal line 31, and the cathode is connected to the signal line 32; the anode of the LED42 with the same color as the LED41 is connected to the signal line 32, and the cathode is connected to the signal line 31; and the anode of the LED51 is connected to the signal line 32, and the cathode is connected to the signal line 33; the anode of LED52 with the same color as LED51 is connected to signal line 33, and the cathode is connected to signal line 32; and the anode of the LED61 is connected to the signal line 33, and the cathode is connected to the signal line 31; the anode of LED62 with the same color as LED61 is connected to signal line 31, and the cathode is connected to signal line 33;

the control system includes a single chip microcomputer, and there are three groups of output control signals, each of which includes two path of signals being first signals and second signals, which are called P signals and N signals respectively in the specification and drawings of the present application, and are simplified as "P" and "N" respectively in the drawings; wherein, the P signal is a PWM signal with a duty ratio of 0 to 100%, and the N signal is a PWM signal with a duty ratio of 0 or 100%; the single chip microcomputer sequentially and circularly outputs two groups of control signals to drive two control components;

when a group of control signals are output to a control module, if the P signal outputs a PWM signal with a duty ratio greater than 0, the N signal is set to a low level; at the same time, another group of control signals in the light strip are output to another control module, and the P signal outputs a PWM signal with a duty ratio equal to 0, and the N signal is set at a high level, thus turning on the LEDs in one direction in the two signal lines;

similarly, when the P signal of one group of control signals outputs a PWM signal with a duty ratio equal to 0 and the N signal is set to a high level, the P signal of the other group outputs a PWM signal with a duty ratio greater than 0 and the N signal is set to a low level, thus turning on the LEDs in the other direction in the two signal lines;

as shown in FIG. 5, the single chip microcomputer outputs two groups of control signals sequentially and circularly, and switches the lit LEDs in turn in at a certain frequency in a certain time with three combinations, thus realizing the color modulation function; wherein IO1, IO3 and IO5 respectively represent P signals of three groups of control signals; IO2, IO4 and IO6 are N signals corresponding to IO1, IO3 and IO5 respectively;

wherein, considering that the ideal impulse signal is difficult to realize, in order to avoid the equipment damage caused by the simultaneous switching of one group of control signals and another group of control signals, an no-output time is also set to limit the time interval of signal switching; when the system is in no-output state, all control components are completely closed; the no-output time is longer than the time from the time when the P signal with a duty ratio greater than 0 is set to 0 duty ratio to the time when the control components are completely turned off.

Figure 2:
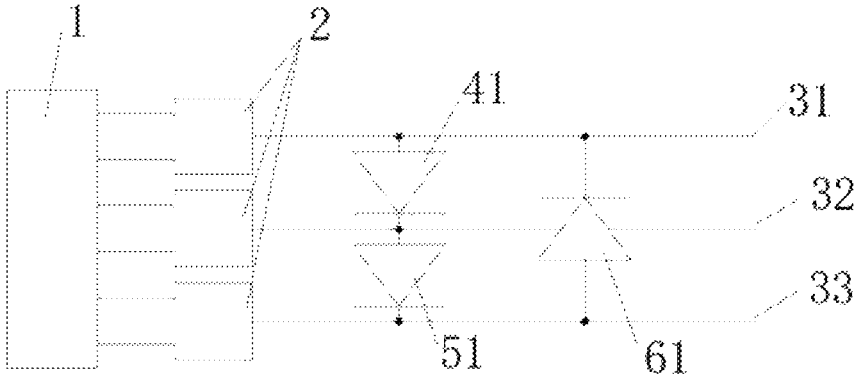
FIG. 2 is a schematic diagram of a light strip with unidirectional LEDs according to the present invention.
Figure 4:
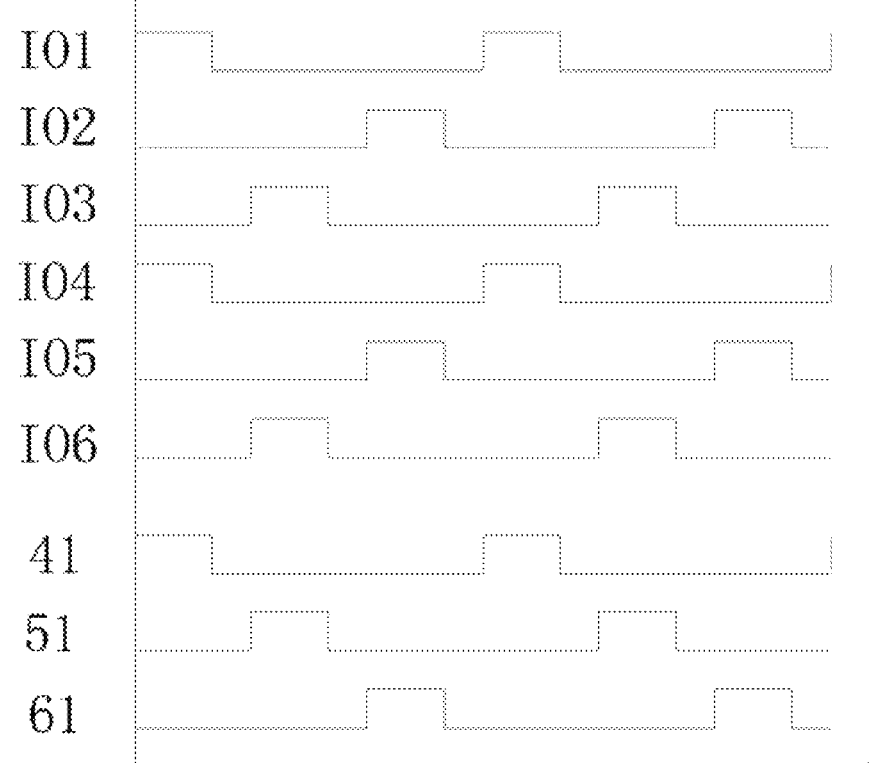
FIG. 4 is a timing chart of the unidirectional LED of the present invention.

In other specific embodiments, as shown in FIG. 2, the light strip includes a signal line 31, a signal line 32 and a signal line 33, and also includes three LEDs with different colors; wherein, the LED of each color is connected between two signal lines in the same direction, specifically:

the anode of the LED41 is connected to the signal line 31, and the cathode is connected to the signal line 32; and the anode of the LED51 is connected to the signal line 32, and the cathode is connected to the signal line 33; and the anode of the LED61 is connected to the signal line 33, and the cathode is connected to the signal line 31;

the control system includes a single chip microcomputer, and there are three groups of output control signals, each of which includes two paths of signals, which are called P signal and N signal respectively; wherein, the P signal is a PWM signal with a duty ratio of 0 to 100%, and the N signal is a PWM signal with a duty ratio of 0 or 100%; the single chip microcomputer sequentially and circularly outputs two groups of control signals to drive two control components;

when a group of control signals are output to a control module, if the P signal outputs a PWM signal with a duty ratio greater than 0, the N signal is set to a low level; at the same time, when another group of control signals in the light strip are output to another control module, and the P signal outputs a PWM signal with a duty ratio equal to 0, the N signal is set at a high level, thus turning on the LEDs between the two signal lines;

as shown in FIG. 4, the single chip microcomputer outputs two groups of control signals sequentially and circularly, and switches the lit LEDs in turn at a certain frequency in a certain time with three combinations, thus realizing the color modulation function, wherein IO1, IO3 and IO5 respectively represent the P signals of the three groups of control signals; IO2, IO4 and IO6 are the same group of N signals as IO1, IO3 and IO5 respectively;

wherein, considering that the ideal impulse signal is difficult to realize, in order to avoid the equipment damage caused by the simultaneous switching of one group of control signals and another group of control signals, an no-output time is also set to limit the time interval of signal switching; when the system is in no-output state, all control components are completely closed; the no-output time is longer than the time from the time when the P signal with a duty ratio greater than 0 is set to 0 duty ratio to the time when the control components are completely turned off.

In some embodiments, the light strip also has a wireless communication module 11 electrically connected with the control system, and when the light strip receives an external control signal, it changes the current light color and intensity.

The present invention also provides a LED strip color modulation method:

at least three control components are respectively coupled with the control system and signal lines with the same number as the control components, and an LED of one color is connected between every two signal lines; the control system sequentially and circularly outputs two groups of control signals, thereby sequentially and circularly driving two control components, and the total number of control signals output by the control system is not less than the number of LED colors.

In some embodiments, the control component includes an H-bridge half-bridge circuit consisting of a P-type MOSFET and an N-type MOSFET; in other embodiments, the same effect can be achieved by setting additional chips to drive two N-type MOSFETs.

In some embodiments, the light strip includes three signal lines and three LEDs with different colors, and each LED is connected between two of the signal lines in two directions; the control system includes a single chip microcomputer, and there are three groups of output control signals, each of which includes two signals, which are called P signal and N signal respectively; wherein, the P signal is a PWM signal with a duty ratio of 0 to 100%, and the N signal is a PWM signal with a duty ratio of 0 or 100%; the single chip microcomputer sequentially and circularly outputs two groups of control signals to drive two control components;

when a group of control signals are output to a control component, if the P signal outputs a PWM signal with a duty ratio greater than 0, the N signal is set to a low level; at the same time, when another group of control signals in the light strip are output to another control module, and the P signal outputs a PWM signal with a duty ratio equal to 0, the N signal is set at a high level, thus turning on the LEDs in one direction of the two signal lines;

similarly, when the P signal of one group of control signals outputs a PWM signal with a duty ratio equal to 0 and the N signal is set to a high level; when the P signal of the other group outputs a PWM signal with a duty ratio greater than 0, the N signal is set to a low level, thus turning on the LEDs in the other direction of the two signal lines;

the single chip microcomputer outputs two groups of control signals sequentially and circularly, and switches the lit LEDs in turn at a certain frequency in a certain time with three combinations, thus realizing the color modulation function;

wherein, considering that the ideal impulse signal is difficult to realize, in order to avoid the equipment damage caused by the simultaneous switching of one group of control signals and another group of control signals, an no-output time is also set to limit the time interval of signal switching; when the system is in no-output state, all control components are completely closed; the no-output time is longer than the time from the time when the P signal with a duty ratio greater than 0 is set to 0 duty ratio to the time when the control components are completely turned off.

In other embodiments, the light strip includes three signal lines and three different colors of LEDs, and each color of LED is connected between two of the signal lines in the same direction; the control system includes a single chip microcomputer, and there are three groups of output control signals, wherein each group of control signals includes two signals, which are called P signal and N signal respectively, wherein the P signal is a PWM signal with a duty ratio of 0 to 100%, and the N signal is a PWM signal with a duty ratio of 0 or 100%; the single chip microcomputer sequentially and circularly outputs two groups of control signals to drive two control components;

when a group of control signals are output to a control component, if the P signal outputs a PWM signal with a duty ratio greater than 0, the N signal is set to a low level; at the same time, when another group of control signals in the light strip are output to another control module, and the P signal outputs a PWM signal with a duty ratio equal to 0, the N signal is set at a high level, thus turning on the LEDs between the two signals;

the single chip microcomputer outputs two groups of control signals sequentially and circularly, and switches the lit LEDs in turn in a certain frequency and time with three combinations, thus realizing the color modulation function;

wherein, considering that the ideal impulse signal is difficult to realize, in order to avoid the equipment damage caused by the simultaneous switching of one group of control signals and another group of control signals, an no-output time is also set to limit the time interval of signal switching; when the system is in no-output state, all control components are completely closed; the no-output time is longer than the time from the time when the P signal with a duty ratio greater than 0 is set to 0 duty ratio to the time when the control components are completely turned off.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another or may be combined in various ways. All possible combinations and sub-combinations are intended to fall within the scope of the present disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

The invention has now been described in detail for the purposes of clarity and understanding. However, those skilled in the art will appreciate that certain changes and modifications may be practiced within the scope of the appended claims.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

What is claimed is:

1. A light emitting diode (LED) strip, wherein said strip comprises at least three LEDs with different colors and at least three signal lines, and an LED with one color is connected between every two signal lines; and wherein, the LED strip further comprises control components with a same number as said signal lines, and said control components are respectively connected at one end of said signal lines; and wherein the LED strip further comprises a control system coupled with said control components and used for outputting two groups of control signals, and a total number of said control signals output by said control system is not less than a number of LED colors;

wherein each group of said control signals comprises a first signal and a second signal; and wherein said first signal is a Pulse Width Modulation (PWM) signal with a duty ratio of 0 to 100%, and said second signal is a PWM signal with a duty ratio of 0 or 100%;

two groups of said control signals are output to two corresponding control components to turn on the LED/LEDs connected between two signal lines that are connected to the two corresponding control components; the at least three LEDs are driven to turn on one after another in cyclic sequence.

2. The LED strip according to claim 1, wherein said control system comprises a single chip microcomputer; and wherein, one of said control components comprises a half-bridge (H-bridge) circuit comprising two metal-oxide-semiconductor field-effect transistors (MOSFETs).

3. The LED strip of claim 1, wherein said LEDs comprise at least red, green and blue; and wherein said LED of each color is connected between said two signal lines in two directions.

4. The LED strip of claim 1, wherein said LEDs comprise at least red, green and blue; and, wherein said LED of each color has a same connection direction between said two signal lines, and each signal line is electrically connected with an anode and a cathode of said LEDs of two colors respectively.

5. The LED strip according to claim 1, wherein there is at least one no-output time between a process that said first signal of a same group of control signals takes a high level and a process that said second signal takes a high level.

6. The LED strip according to claim 5, wherein the no-output time is longer than a period from a time when the first signal with a duty ratio greater than 0 is set to 0 duty ratio to a time when the control components are completely turned off.

7. The LED strip according to claim 1, wherein said control system further comprises a wireless communication module, and said wireless communication module receives an external control signal, so that said LED has a controlled change effect.

8. A light emitting diode (LED) strip color modulation method, wherein at least three control components are respectively coupled to a control system and signal lines with a same number as said control components, and an LED of one color is connected between every two signal lines; and said control system outputs two groups of control signals, each group of said control signals comprises a first signal and a second signal, said first signal is a Pulse Width Modulation (PWM) signal with a duty ratio of 0 to 100%, and said second signal is a PWM signal with a duty ratio of 0 or 100%; a total number of said control signals output by said control system is not less than a number of LED colors;

wherein two groups of said control signals are output to two corresponding control components to turn on the LED/LEDs connected between two signal lines that are connected to the two corresponding control components; the at least three LEDs are driven to turn on one after another in cyclic sequence.

9. The LED strip color modulation method according to claim 8, wherein said control system comprises a single chip microcomputer; and wherein, one of said control components comprises a half-bridge (H-bridge) circuit comprising two metal-oxide-semiconductor field-effect transistors (MOS-FETs).

10. The LED strip color modulation method according to claim 8, wherein said LEDs comprise at least red, green and blue; and wherein said LED of each color is connected between said two signal lines in two directions.

11. The LED strip color modulation method according to claim 8, wherein said LEDs comprise at least red, green and blue; and, wherein said LED of each color has a same connection direction between said two signal lines, and each signal line is electrically connected with an anode and a cathode of said LEDs of two colors respectively.

12. The LED strip color modulation method according to claim 8, wherein there is at least one no-output time between a process that said first signal of a same group of control signals takes a high level and a process that said second signal takes a high level.

13. The LED strip according to claim 12, wherein the no-output time is longer than a period from a time when the first signal with a duty ratio greater than 0 is set to 0 duty ratio to a time when the control components are completely turned off.

* * * * *